United States Patent
McCoy et al.

(10) Patent No.: US 7,456,714 B2
(45) Date of Patent: Nov. 25, 2008

(54) MAGNETOSTRICTION AIDED SWITCHING

(75) Inventors: Bryan Wayne McCoy, Scottsdale, AZ (US); Jason Walter Swanson, Tempe, AZ (US)

(73) Assignee: IGO, Inc., Scottsdale, AZ (US)

( * ) Notice: Subject to any disclaimer, the term of this patent is extended or adjusted under 35 U.S.C. 154(b) by 81 days.

(21) Appl. No.: 11/545,652

(22) Filed: Oct. 9, 2006

(65) Prior Publication Data
US 2008/0084261 A1   Apr. 10, 2008

(51) Int. Cl.
H01F 7/00 (2006.01)
H01H 55/00 (2006.01)

(52) U.S. Cl. .............. 335/215; 335/3; 336/20; 310/26; 361/206

(58) Field of Classification Search ...... 335/3, 335/215; 336/20; 310/26; 361/206
See application file for complete search history.

(56) References Cited

U.S. PATENT DOCUMENTS

| | | | | | |
|---|---|---|---|---|---|
| 4,484,161 A | * | 11/1984 | Barger | ...................... | 333/219.1 |
| 5,694,097 A | * | 12/1997 | Nilsson | ..................... | 335/4 |
| 5,792,284 A | * | 8/1998 | Cedell et al. | ................ | 148/301 |
| 6,298,467 B1 | * | 10/2001 | Chuang et al. | ................ | 716/2 |
| 6,300,855 B1 | * | 10/2001 | Clark et al. | ................. | 335/215 |
| 6,553,847 B2 | * | 4/2003 | Garshelis | ............... | 73/862.336 |
| 7,350,425 B2 | * | 4/2008 | Cripe | ................... | 73/862.333 |
| 2004/0206922 A1 | * | 10/2004 | Du Plessis et al. | ..... | 251/129.06 |
| 2005/0146231 A1 | * | 7/2005 | Or et al. | ...................... | 310/26 |
| 2008/0085197 A1 | * | 4/2008 | McCoy et al. | .............. | 417/322 |

* cited by examiner

*Primary Examiner*—Elvin G Enad
*Assistant Examiner*—Mohamad A Musleh
(74) *Attorney, Agent, or Firm*—Jackson Walker LLP; Robert C. Klinger

(57) ABSTRACT

A method for reducing a temperature rise of a magnetic material is provided. The method includes applying force to the magnetic material to reduce a dimensional change of the magnetic material during a first part of an operation cycle, such as due to magnetostriction. The force is removed from the magnetic material during a second part of an operation cycle, allowing magnetostrictive dimensional changes to occur.

5 Claims, 2 Drawing Sheets

MAGNETOSTRICTION AIDED SWITCHING

CROSS REFERENCE TO RELATED APPLICATIONS

Cross reference is made to the following commonly assigned U.S. patent applications filed herewith: U.S. Ser. No. 11/545,132, entitled "MAGNETOSTRICTION AIR PUMP."

FIELD OF THE INVENTION

The present invention is generally related to power supplies, and more specifically to heat reduction in power adapters.

BACKGROUND OF THE INVENTION

Power supplies such as notebook adapters, wall adapters, and car adapters incur power losses when voltage is converted from one form or level to another form or level, because such conversion processes are less than one hundred percent efficient. The power losses result in heating of the power supply, and the heat that must be dissipated to the environment. Due to regulatory and marketing considerations, the temperature rise that can be tolerated for such power supplies is usually related to a maximum allowable surface temperature, such as 85 degrees Celsius, and a design ambient environmental temperature, such as 40 degrees Celsius. One way of meeting such limitations is to increase the size of power supplies in order to provide greater surface area for the dissipation of heat.

Another way of meeting such limitations without increasing the size of power supplies is use forced air or active cooling in which cool air is moved over the heat producing components and the resulting warm air is then vented away from the main body of the power supply. One problem with using forced air or active cooling is that it is usually accomplished by the use of a fan, which uses energy and therefore reduces efficient, and which can be noisy, expensive, can require a significant amount of space, and can have a short lifetime.

Another way to meet such limitations is to improve the efficiency of the power supply, such as by reducing the on resistance of MOSFETs or placing multiple diodes in parallel to reduce power losses. While these solutions provide some measure of improvement, one of the largest producers of heat for power supplies is the main transformer. Faraday's laws govern the efficiency that can be obtained by the transformer and thus the heat produced. The cooler a transformer is, the cooler a power supply will become. Unfortunately, these prior solutions do not address the main source of heat, which is the main transformer.

SUMMARY OF INVENTION

The present invention comprises a method for reducing heating in a switching power supply using magnetostriction. One exemplary embodiment of the invention utilizes the selective application and release of mechanical pressure to magnetic flux conducting structures of the transformer of a switching power supply to improve the efficiency of the transformer and reduce losses.

DETAILED DESCRIPTION OF THE PRESENT INVENTION

Figure 1:
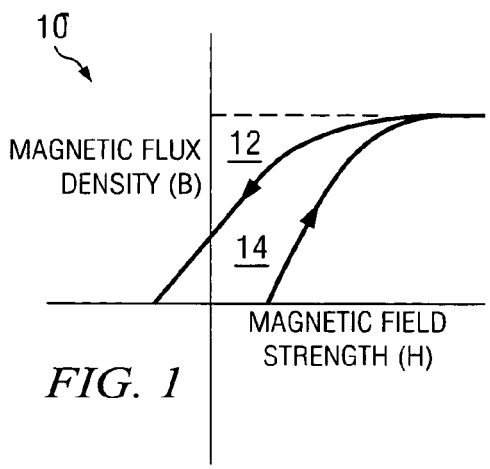
FIG. 1 is an exemplary hysteresis curve for a ferromagnetic material.

Referring to FIG. 1, there is generally shown at 10 a plot of an exemplary magnetic hysteresis curve plotting magnetic field strength or "H" versus flux density or "B" for a ferromagnetic material, such as a transformer core. As the magnetic field strength increases as shown by the arrow on the right, the flux density also increases as the magnetic domains of the ferromagnetic material become aligned. When the magnetic field strength is then decreased as shown by the arrow on the left, the flux density decreases more slowly, because the aligned magnetic domains tend to stay aligned. Area 12 is proportional to the useful energy that can be delivered to a load by a transformer, whereas area 14 is proportional to energy that must be used to cause the magnetic domains of the ferromagnetic material to change orientation, a process that generates heat. As such, the size of area 14 is proportional to the amount of heat generated in the transformer core, and also to the temperature rise of the core if cooling is not increased to the core during operation.

Figure 2:
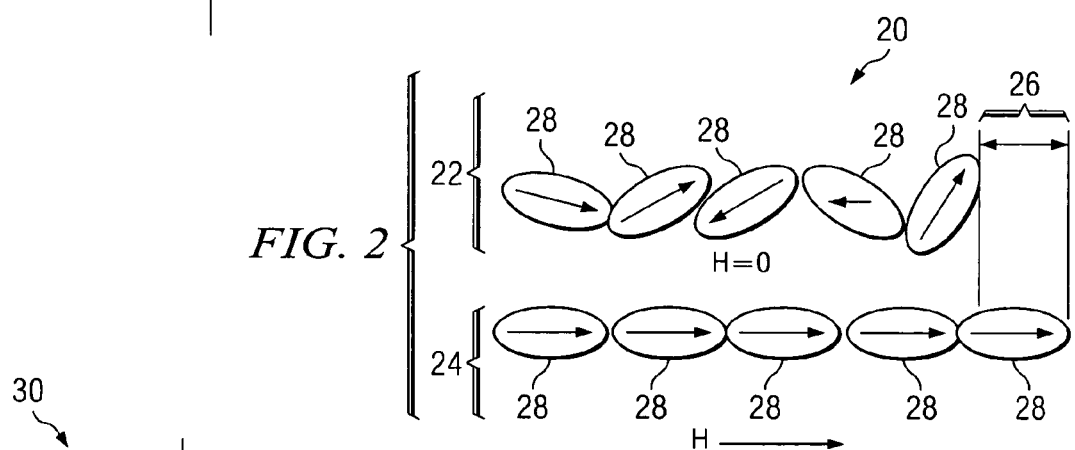
FIG. 2 a representation of the magnetostriction effect of a magnetic field on magnetic domains.

Referring now to FIG. 2, there is shown at 20 a plurality of magnetic domains 28. In ferromagnetic materials used in switching power supplies, magnetic domains 28 naturally occur in a random distribution 22. When a magnetic field is applied to the ferromagnetic material, the magnetic domains 28 align with the magnetic field as shown in the aligned distribution 24. This alignment creates a change 26 in material dimensions, an effect known as magnetostriction. If mechanical force is used to reduce or prevent magnetostriction, then the magnetic properties of the magnetic material as defined by the hysteresis curve will be altered, as discussed below.

Figure 3:
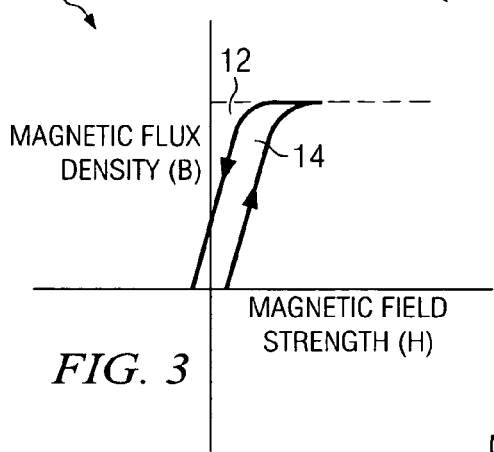
FIG. 3 is an exemplary hysteresis curve for a ferromagnetic material that is exposed to pressure to prevent expansion due to magnetostriction.

Referring now to FIG. 3, there is shown at 30 a hysteresis curve for a transformer core with mechanical pressure applied to reduce or prevent dimensional changes of the transformer core. The useful energy represented by area 12 delivered to the load can be the same as a transformer having a core that is allowed to change structurally, but the energy loss represented by area 14 in the magnetic material can be substantially decreased. As this energy loss results in heating of the magnetic material, the application of pressure to the magnetic material to reduce or prevent dimensional changes can reduce the temperature rise in the magnetic material during operation.

Figure 4:
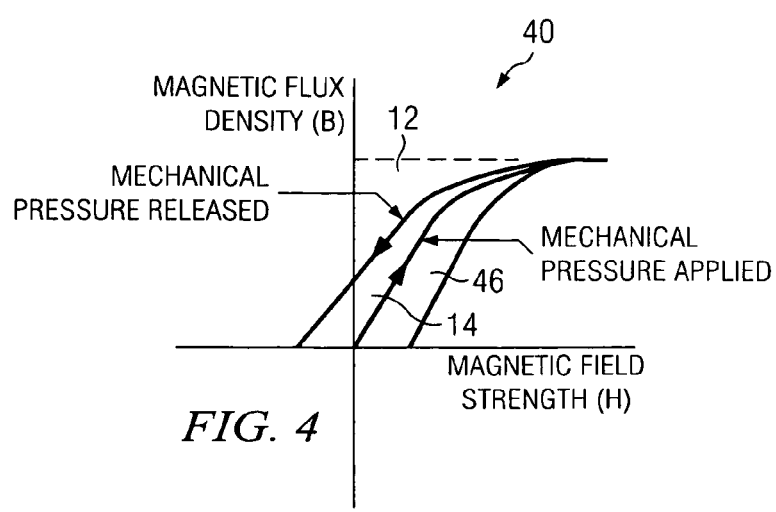
FIG. 4 is an exemplary hysteresis curve for a ferromagnetic material that is exposed to pressure to prevent expansion due to magnetostriction during a portion of a switching cycle, in accordance with an exemplary embodiment of the present invention.

Referring now to FIG. 4, there is shown at 40 a hysteresis curve for a transformer core in a switching power supply. By applying pressure to the magnetic flux conducting structure of the transformer while the magnetic field is increasing and removing pressure when the magnetic flux is decreasing, a heat energy savings represented by area 46 is realized. The difference between a normal switching cycle and a pressure switching cycle is that energy that was normally lost as heat will be reduced in a pressure switching cycle. When pressure is applied to the magnetic structure at the beginning of the switching cycle and then released at the proper time, the same amount of energy represented by area 12 is released to the load, but the energy changed to heat will be reduced.

Figure 5:
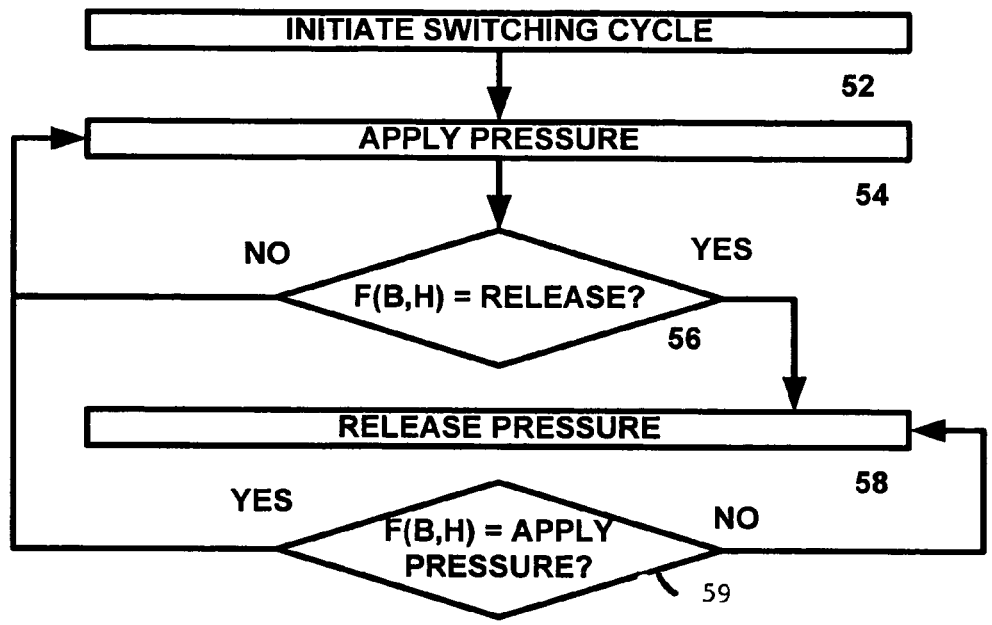
FIG. 5 is a flow chart of a method for applying pressure to a magnetic material in accordance with an exemplary embodiment of the present invention.

FIG. 5 is a flow chart of a method 50 for applying pressure to a magnetic material in accordance with an exemplary embodiment of the present invention. Method 50 begins at 52, where a switching cycle is initiated. In one exemplary embodiment, the switching cycle can be a switching cycle of a switching power supply. The method then proceeds to 54, where pressure is applied based on the magnetic field and flux characteristics of a magnetic structure, such as to prevent the dimensions of the magnetic structure from being altered due to magnetostrictive effects. In one exemplary embodiment, the magnetic structure can be a transformer core for a switching power supply. Pressure can be applied by providing power to a press or relay coil, by opening a hydraulic valve to allow hydraulic force to be applied, or in other suitable manners. The method then proceeds to 56.

At 56, it is determined whether the magnetic field and flux characteristics in the magnetic structure have reached a point at which pressure should be removed, such as to allow magnetostrictive effects to change the dimensions of the magnetic structure. In one exemplary embodiment, the magnetic field and flux can be approximated from the measured current from a transformer winding, the number of turns in the transformer, the physical characteristics of the transformer core, and other suitable information. Likewise, the magnetic field, magnetic flux, or other suitable parameters can be directly measured or other suitable processes can be used to determine whether the pressure that is applied to the magnetic structure can be released. If it is determined that the pressure should not be released, the method returns to 54, otherwise the method proceeds to 58.

At 58, pressure is released, such as by removing power to a press or relay, by closing a hydraulic valve, or in other suitable manners. The method then proceeds to 59, where it is determined whether pressure should be applied again based on the magnetic field and flux characteristics. If it is determined that pressure should be applied, the method returns to 54, otherwise the method returns to 58.

In operation, method 50 allows pressure to be applied to a magnetic structure, such as a transformer core, to prevent or limit the amount of a dimensional change of the magnetic structure, so as to improve the efficiency of the magnetic structure in a power conversion process and to reduce the amount of heat generated within the magnetic material.

Figure 6:
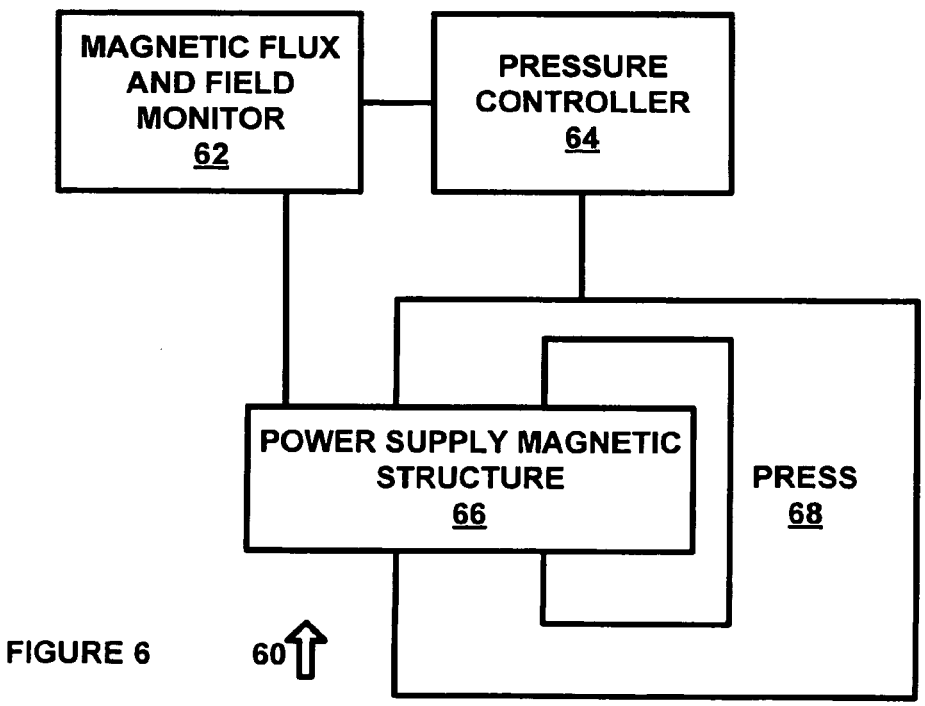
FIG. 6 is a diagram of a pressure control system for a power supply magnetic structure in accordance with an exemplary embodiment of the present invention.

FIG. 6 is a diagram of a pressure control system 60 for a power supply magnetic structure in accordance with an exemplary embodiment of the present invention. Pressure control system 60 includes magnetic flux and field monitor 62 and pressure controller 64, each of which can be implemented in hardware, software, or a suitable combination of hardware and software, and which can be one or more software systems operating on a suitable processor, such as a digital signal processor. As used herein, a hardware system can include discrete semiconductor devices, an application-specific integrated circuit, a field programmable gate array, a general purpose processing platform, or other suitable devices. A software system can include one or more objects, agents, threads, lines of code, subroutines, separate software applications, user-readable (source) code, machine-readable (object) code, two or more lines of code in two or more corresponding software applications, databases, or other suitable software architectures. In one exemplary embodiment, a software system can include one or more lines of code in a general purpose software application, such as an operating system, and one or more lines of code in a specific purpose software application.

Magnetic flux and field monitor 62 is coupled to pressure controller 64 and power supply magnetic structure 66. As used herein, the term "couple" and its cognate terms such as "coupled" and "couples" can include a physical connection (such as a shaft coupling or electrical conductor), a virtual connection (such as through one or more randomly assigned memory locations of a data processing systems), a logical connection (such as through one or more logical devices), or other suitable connections or combinations of connections.

Magnetic flux and field monitor 62 determines the magnetic field and flux characteristics of power supply magnetic structure 66, such as by approximating the magnetic flux and field from the measured current in a transformer winding, an open loop voltage of a transformer winding, the number of turns in the transformer, the physical characteristics of the transformer core, whether pressure is currently being applied to power supply magnetic structure 66, and other suitable information. Likewise, magnetic flux and field monitor 62 can directly measure the magnetic field, magnetic flux, or other suitable parameters, or can perform other suitable processes to determine the magnetic flux and field characteristics within power supply magnetic structure 66 so as to determine the current magnetic properties of the power supply magnetic structure relative to the hysteresis curve for the power supply magnetic structure material. Magnetic flux and field monitor generates control data for pressure controller to cause pressure to be applied to or removed from power supply magnetic structure 66.

Pressure controller 64 receives the control data from magnetic flux and field monitor 62 and causes press 68 to apply or release pressure to power supply magnetic structure 66. In one exemplary embodiment, press 68 can utilize magnetic coils, motors, or other suitable devices to generate force that is applied to power supply magnetic structure 66, and can apply and remove power to such devices as necessary to cause force to be applied to power supply magnetic structure 66. Likewise, pressure controller 64 can cause hydraulic pressure can be applied by opening a valve and released by closing the valve, or other suitable processes can be used to apply or release pressure.

In operation, a power supply magnetic structure 66, such as a transformer core, is alternately placed under pressure and depressurized, to reduce or prevent dimensional change of the power supply magnetic structure 66. In this manner, the generation of heat within the magnetic material due to hysteresis can be reduced, so as to reduce the temperature rise of the magnetic material.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A method for reducing a temperature rise of a magnetic material comprising:
   applying force to the magnetic material to reduce a dimensional change of the magnetic material during a first part of an operation cycle;
   removing force from the magnetic material during a second part of an operation cycle; and
   wherein applying the force to the magnetic material to reduce the dimensional change of the magnetic material during the first part of the operation cycle further comprises:
   determining a magnetic flux and a magnetic field density of the magnetic material; and
   applying the force to the magnetic material to reduce the dimensional change of the magnetic material during the first part of the operation cycle based on the magnetic flux and the magnetic field density.

2. The method of claim 1 wherein determining the magnetic flux and the magnetic field density comprises calculating the magnetic flux and the magnetic field density based on a winding current magnitude and magnetic material dimensional characteristics.

3. The method of claim 1 wherein determining the magnetic flux comprises measuring the magnetic flux using a magnetic flux probe.

4. The method of claim 1 wherein determining the magnetic field density comprises measuring the magnetic field density using a magnetic field density probe.

5. A method for reducing a temperature rise of a magnetic material comprising:
   applying force to the magnetic material to reduce a dimensional change of the magnetic material during a first part of an operation cycle;
   removing force from the magnetic material during a second part of an operation cycle, wherein removing the force from the magnetic material during the second part of the operation cycle comprises:
   determining a magnetic flux and a magnetic field density of the magnetic material; and
   wherein removing the force to the magnetic material to allow the dimensional change of the magnetic material during the second part of the operation cycle based on the magnetic flux and the magnetic field density.

* * * * *